(12) United States Patent
Cao et al.

(10) Patent No.: US 9,147,824 B1
(45) Date of Patent: Sep. 29, 2015

(54) REACTIVE CONTACTS FOR 2D LAYERED METAL DICHALCOGENIDES

(71) Applicant: International Business Machines Corporation, Armonk, NY (US)

(72) Inventors: Qing Cao, Yorktown Heights, NY (US); Shu-Jen Han, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/272,889

(22) Filed: May 8, 2014

(51) Int. Cl.
| | |
|---|---|
| H01L 21/44 | (2006.01) |
| H01L 21/06 | (2006.01) |
| H01L 39/24 | (2006.01) |
| H01L 29/40 | (2006.01) |
| H01L 49/02 | (2006.01) |
| H01L 21/02 | (2006.01) |

(52) U.S. Cl.
CPC ...... H01L 39/2412 (2013.01); H01L 21/02485 (2013.01); H01L 21/02568 (2013.01); H01L 28/60 (2013.01); H01L 29/401 (2013.01)

(58) Field of Classification Search
CPC ... H01L 39/2412; H01L 28/60; H01L 29/401; H01L 21/02485; H01L 21/02568
USPC ............... 438/610, 102; 257/42, 44
See application file for complete search history.

(56) References Cited

U.S. PATENT DOCUMENTS

| | | | |
|---|---|---|---|
| 4,416,959 A | 11/1983 | Skotheim | |
| 4,996,108 A | 2/1991 | Divigalpitiya et al. | |
| 5,441,897 A | 8/1995 | Noufi et al. | |
| 6,706,566 B2 * | 3/2004 | Avouris et al. | 438/132 |
| 7,341,917 B2 | 3/2008 | Milliron et al. | |
| 7,632,701 B2 | 12/2009 | Dhere et al. | |
| 2011/0214725 A1 | 9/2011 | Beck | |

FOREIGN PATENT DOCUMENTS

| | | |
|---|---|---|
| EP | 0173641 A2 | 3/1986 |
| WO | WO2012093360 A1 | 7/2012 |

OTHER PUBLICATIONS

T. Wada et al., "Characterization of the Cu(In,Ga)Se2/Mo interface in CIGS solar cells," Thin Solid Films, vol. 387, No. 1, pp. 118-122 (May 2001).

(Continued)

*Primary Examiner* — Tu-Tu Ho
(74) *Attorney, Agent, or Firm* — Vazken Alexanian; Michael J. Chang, LLC

(57) ABSTRACT

Techniques for forming metal contacts to LMDC-based devices are provided. In one aspect, a method of forming a metal contact to a LMDC semiconductor material includes the steps of: depositing a contact metal onto the LMDC semiconductor material; and annealing the LMDC semiconductor material and the contact metal under conditions sufficient to react the contact metal with the LMDC semiconductor material and thereby form a buffer layer as an interface between the contact metal and the LMDC semiconductor material that compositionally is a transition from the LMDC semiconductor material to the contact metal and connects the LMDC semiconductor material and the contact metal by covalent bonds. The LMDC semiconductor material can be a material having a formula $MX_2$, wherein M is a metal, and X is a chalcogen. A LMDC-based device and techniques for forming the device are also provided.

21 Claims, 3 Drawing Sheets

(56) References Cited

OTHER PUBLICATIONS

D. Abou-Ras et al., "Formation and characterisation of MoSe2 for Cu(In,Ga)Se2 based solar cells," Thin Solid Films, vol. 480, 2005, pp. 433-438 (Published Dec. 2004).

S. Das et al., "High performance multilayer MoS2 transistors with scandium contacts," Nano Letters, vol. 13, No. 1, pp. 100-105 (Dec. 2012).

J.B. Pang, et al., "Preparation and characteristics of MoSe2 interlayer in bifacial Cu(In,Ga)Se2 solar cells," Physics Procedia, vol. 32, pp. 372-378 (Jun. 2012).

Radisavljevic et al., "Single-layer MoS2 transistors," Nature Nanotechnology, vol. 6, Issue 3, pp. 147-150 (Jan. 2011).

Wang et al. "Electronics and optoelectronics of two-dimensional transition metal dichalcogenides," Nature Nanotechnology, vol. 7, pp. 699-712 (Nov. 2012).

* cited by examiner

REACTIVE CONTACTS FOR 2D LAYERED METAL DICHALCOGENIDES

FIELD OF THE INVENTION

The present invention relates to two-dimensional (2D) layered metal dichalcogenides (LMDC)-based devices, and more particularly, to techniques for forming metal contacts (e.g., source and drain metal contacts) to LMDC-based devices.

BACKGROUND OF THE INVENTION

Two-dimensional (2D) layered metal dichalcogenides (LMDC) are a kind of new nanomaterial with potential applications in transistors, photodetectors, and electroluminescent devices. LMDC materials offer intrinsic ultra-thin body, high mobility, and adjustable bandgap for these applications. See, for example, Radisavljevic et al., "Single-layer $MoS_2$ transistors," Nature Nanotechnology, Volume 6, Issue 3, pp. 147-150 (2011).

LMDC materials, however, generally form bad electrical contacts with metals commonly used for source/drain electrodes. For instance, a sizeable Schottky barrier is produced with a LMDC and titanium, nickel, and platinum. See, for example, Das et al., "High Performance Multilayer $MoS_2$ Transistors with Scandium Contacts," Nano Letters, vol. 13, issue 1, pgs. 100-105 (January 2013). The application of LMDC materials in scaled devices has thus far been limited.

Accordingly, techniques for effectively implementing LMDC materials in device applications would be desirable.

SUMMARY OF THE INVENTION

Techniques for forming metal contacts (e.g., source and drain metal contacts) to two-dimensional (2D) layered metal dichalcogenides (LMDC)-based devices are provided. In one aspect of the invention, a method of forming a metal contact to a LMDC semiconductor material is provided. The method includes the steps of: depositing a contact metal onto the LMDC semiconductor material; and annealing the LMDC semiconductor material and the contact metal under conditions sufficient to react the contact metal with the LMDC semiconductor material and thereby form a buffer layer as an interface between the contact metal and the LMDC semiconductor material that compositionally is a transition from the LMDC semiconductor material to the contact metal and connects the LMDC semiconductor material and the contact metal by covalent bonds. The LMDC semiconductor material can be a material having a formula $MX_2$, wherein M is a metal, and X is a chalcogen.

In another aspect of the invention, a method for forming a LMDC-based transistor device is provided. The method includes the steps of: forming a LMDC semiconductor material on a substrate; selectively depositing a contact metal onto portions of the LMDC semiconductor material that serve as source and drain regions of the transistor device; annealing the LMDC semiconductor material and the contact metal under conditions sufficient to react the contact metal with the LMDC semiconductor material and thereby form a buffer layer as an interface between the contact metal and the LMDC semiconductor material that compositionally is a transition from the LMDC semiconductor material to the contact metal and connects the LMDC semiconductor material and the contact metal by covalent bonds; depositing a gate dielectric onto exposed surfaces of the contact metal and the LMDC semiconductor material; and forming a gate on the gate dielectric over a portion of the LMDC semiconductor material that serves as a channel of the transistor device.

In another aspect of the invention, a LMDC-based transistor device is provided. The transistor device includes a LMDC semiconductor material on a substrate; a contact metal present on portions of the LMDC semiconductor material that serve as source and drain regions of the transistor device; a buffer layer as an interface between the contact metal and the LMDC semiconductor material that compositionally is a transition from the LMDC semiconductor material to the contact metal and which connects the LMDC semiconductor material and the contact metal by covalent bonds; a gate dielectric on the contact metal and the LMDC semiconductor material; and a gate on the gate dielectric over a portion of the LMDC semiconductor material that serves as a channel of the transistor device.

A more complete understanding of the present invention, as well as further features and advantages of the present invention, will be obtained by reference to the following detailed description and drawings.

DETAILED DESCRIPTION OF PREFERRED EMBODIMENTS

As provided above, while two-dimensional (2D) layered metal dichalcogenides (LMDC) materials offer desirable properties for many device applications such as intrinsic ultra-thin body, high mobility, and adjustable bandgap, the wide scale implementation of LMDC materials has been hindered by the poor electrical contacts these materials form with common device electrode materials. Provided herein are techniques for integrating LMDC materials into device fabrication processes wherein a thermal annealing process in an inert and/or sulfur and/or selenium atmosphere is used to form a buffer layer between the LMDC and contact metal. By way of formation of the buffer layer, what would otherwise end up being a LMDC/metal Schottky junction is more of an ohmic contact.

The present techniques for forming metal contacts to a LMDC material are first described generally by way of reference to FIGS. 1-4. An exemplary implementation of the present techniques to form source and drain region contacts in a LMDC-based transistor device is then described by way of reference to FIGS. 5-9.

Figure 1:
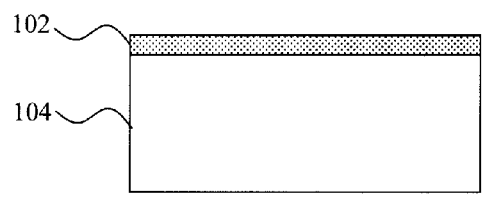
FIG. 1 is a cross-sectional diagram illustrating a two-dimensional (2D) layered metal dichalcogenides (LMDC) semiconductor material having been deposited onto a substrate according to an embodiment of the present invention.

As shown in FIG. 1, the process generally begins with a LMDC semiconductor material 102 being deposited on a suitable substrate 104. The term "LMDC semiconductor material" (or simply "LMDC material"), as used herein, refers to materials having the general formula $MX_2$ wherein M is a metal (e.g., titanium (Ti), zirconium (Zr), hafnium (Hf), rutherfordium (Rf), vanadium (V), niobium (Nb), tantalum (Ta), dubnium (Db), chromium (Cr), molybdenum (Mo), tungsten (W), seaborgium (Sg), tin (Sn) and indium (In)), and X is a chalcogen (e.g., sulfur (S), selenium (Se), or tellurium (Te)). As described in detail below, LMDC materials may be deposited on a substrate using bottom-up synthesis techniques (such as chemical vapor deposition (CVD) or a solution-based deposition process) or top-down synthesis (such as exfoliation). In bulk form, an LMDC material exists as a stack of strongly (in-plane) bonded layers with weak interlayer (out-of-plane) attraction. See, for example, Wang et al. "Electronics and optoelectronics of two-dimensional transition metal dichalcogenides," Nature Nanotechnology, vol. 7, pgs. 699-712 (November 2012) (hereinafter "Wang"), the contents of which are incorporated by reference as if fully set forth herein. It is due to these weak interlayer attractions that individual, atomically thin layers of the LDMC material may be removed by exfoliation. Thus, it is possible to produce anything from a single monolayer of LMDC material to a stack of (multiple) layers of LMDC material on the substrate. According to an exemplary embodiment, the LMDC semiconductor material 102 deposited on substrate 104 includes from 1 (a single monolayer) to about 5 layers of the LDMC material. There are several factors to consider regarding how many layers of the LDMC material to use: 1) the band structure could be different with different numbers of layers (for example a single layer of $MoS_2$ has a direct bandgap of 1.8 electron volts (eV), while bulk $MoS_2$ has an indirect bandgap of 1.2 eV, and there is a gradual transition from 1 layer to about 7 layers)—and different band structures could be useful for different applications (for example direct bandgap structures will be better for optoelectronics while smaller indirect bandgap structures will be better for electronics); 2) a thinner LDMC material (i.e., based on a fewer number of layers) gives better electrostatics for devices with short channels to overcome the so-called short channel effect with the ultrathin body; however 3) a thicker LDMC material (i.e., based on a greater number of layers) will generally be easier to process and have better uniformity. Some exemplary LMDC materials include, but are not limited to, $MoS/Se_2$, $WS/Se_2$, $SnS/Se_2$, and $InS/Se_2$ wherein the designation "S/Se" as used herein generally indicates an "and/or" relationship, i.e., that either sulfur (and no selenium), selenium (and no sulfur), or a combination of both sulfur and selenium are present in the material.

As highlighted above, the LMDC semiconductor material 102 can be deposited onto the substrate 104 in one of a number of different ways. For example, according to one exemplary embodiment, exfoliation is used to transfer individual layers of the LMDC semiconductor material 102 onto the substrate. In this manner, anywhere from 1 layer (a single monolayer) to a stack of (multiple), e.g., 5 layers, of the LMDC material can be achieved on the substrate 104. According to another exemplary embodiment, the LMDC semiconductor material 102 is deposited onto the substrate 104 using, for example, CVD or a solution-based deposition process. Suitable CVD methods include, but are not limited to low pressure CVD (LPCVD) and plasma-enhanced CVD (PECVD). Suitable solution-based deposition processes include, but are not limited to, electroplating, casting, and spin coating. These bottom-up synthesis techniques can be used to create a bulk form (a stack of multiple layers) of the LMDC material on the substrate. It is also possible to employ these same bottom-up processes to produce a single layer of the LMDC material on the substrate. See, for example, Wang. Thus, with any of the above-described processes (i.e., exfoliation, CVD, solution-based deposition, etc.) anywhere from a single layer to a stack of layers of the LMDC material can be produced on the substrate.

Substrate 104 is being used herein to generally represent any substrate configuration on which a LMDC-based device is to be fabricated, and while shown generically in the figures as a single structure, substrate 104 may in fact include one or more distinct layers. For instance, by way of example only, substrate 104 may include a semiconductor wafer with an insulating layer thereon. The LMDC semiconductor material 102 would then be deposited onto the insulating layer of the substrate. Alternatively, if so desired, the substrate 104 may be a doped semiconductor wafer. In that case, the substrate 104 can serve as a back/bottom gate of the device. The example of a back gated device is described in detail below.

Figure 2:
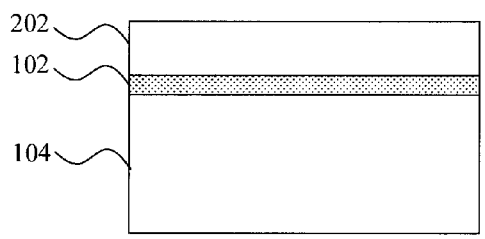
FIG. 2 is a cross-sectional diagram illustrating a contact metal(s) having been deposited onto the LMDC semiconductor material according to an embodiment of the present invention.
Figure 3:
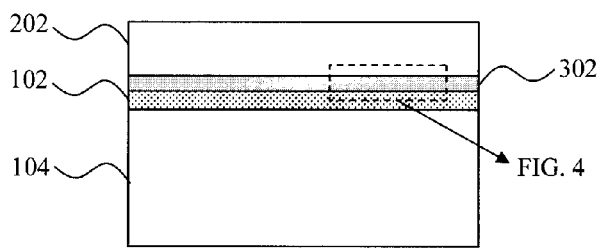
FIG. 3 is a cross-sectional diagram illustrating a thermal annealing having been used to form a buffer layer between the contact metal and the LMDC semiconductor material that is compositionally a transition from the LMDC semiconductor material to the contact metal connected by covalent bonds according to an embodiment of the present invention.

Next, as shown in FIG. 2, a contact metal 202 is deposited onto the LMDC semiconductor material 102. Suitable contact metals 202 include, but are not limited to, copper (Cu), molybdenum (Mo), tungsten (W), indium (In), tin (Sn), or alloys including at least one of the foregoing metals. The contact metal 202 may be deposited, for example, by evaporation, electroplating, etc. As described in detail below, selective deposition of the contact metal (for instance when selectively forming source and drain region contacts) may be accomplished using a conventional lift-off process, wherein the contact metal is deposited through a mask. Excess metal is removed along with the mask, leaving behind contact metal only in the desired locations defined by the mask. By way of example only, the contact metal 202 is deposited onto the LMDC material 102 to a thickness of from about 5 nm to about 100 nm.

As provided above, if one was to simply deposit a contact metal onto a LMDC semiconductor layer, a non-ohmic metal-semiconductor junction, i.e., a Schottky barrier, would result, which introduces additional resistance blocking the current flow. Advantageously, by way of the present techniques, a buffer layer (see below) is created between the contact metal and the underlying LMDC semiconductor which results in an ohmic contact between the LMDC material and the contact metal.

Namely, following deposition of the contact metal 202, a thermal anneal of the contact metal and LMDC is performed under conditions sufficient to react the contact metal 202 with the LMDC to thereby form a buffer layer 302 between the contact metal 202 and the LMDC 102 that compositionally is a transition from stoichiometric (LMDC) semiconductor to (pure) contact metal. See FIG. 3. Stoichiometric LMDC means that the ratio between the number of metal atoms and the number of chalcogenide atoms in the material is the same as what is present in the bulk form of that LMDC material. It is easy to understand that the composition of a layer exfoliated from the bulk material will be the same as that of the bulk material. However, at the reactive interface with the contacts, the metal atom-to-chalcogenide atom ratio will be different from the bulk material due to the inter-diffusion of atoms. By 'pure' contact metal it is meant that the composition is the same as for the bulk contact metal, and is pure in the sense that the contact metal does not contain any chalcogen.

The annealing at a temperature above the reaction threshold helps to induce the reaction between deposited contact metal with underlying LMDC and converts their binding at interface from van der Waals force to covalent bond. A covalent bond is a chemical bond that involves the sharing of electron pairs between atoms. It is a very strong bonding with overlapped electron orbitals. Covalent bonding can be detected using techniques such as x-ray photoelectron spectroscopy (XPS). The strong electron orbital coupling of covalent bonds between metal and (LMDC) semiconductors facilitates the carrier transport through the interface by significant increase of carrier collection efficiency. As provided above, the material composition near the interface could be off stoichiometry due to diffusion of elements during the reaction. When the contact metal is initially deposited onto the LMDC semiconductor layer, the term 'interface' refers to the clear cut boundary between the metal contact and the LMDC channel. The annealing, however, blurs such boundary and leads to the formation of a buffer layer, which becomes the new 'interface.' And in this buffer layer, there will be a gradual transition of composition from a composition identical to the bulk of contact metals (on one side) to a composition identical to the bulk of LMDC (on the other side).

According to an exemplary embodiment, the conditions include an annealing temperature of from about 300 degrees Celsius (° C.) to about 1000° C., for a duration of from about 10 seconds to about 1 hour. By way of example only, the thermal annealing can be performed using a rapid thermal annealing (RTA) process using lamp or laser annealing (which enables high temperatures for short durations) in the presence of a chalcogen-containing vapor (since many chalcogenide elements are volatile—see below). An image of this transitional buffer layer between the LMDC and the contact metal is shown in FIG. 4.

Figure 4:
FIG. 4 is an image of the contact metal, the LMDC semiconductor material, and the transitional buffer layer formed therebetween by way of the thermal annealing process according to an embodiment of the present invention.

Namely, as shown in FIG. 4, post annealing, a buffer layer (labeled "LMDC buffer layer") is formed as an interface between the contact metal (labeled "Metal") and the LMDC semiconductor material (labeled "LMDC Semiconductor"). As described above, the buffer layer compositionally is a transition from the (LMDC) semiconductor to the contact metal and connects the LMDC to the contact metal by covalent bonds.

It is notable that the atmosphere and the duration of the anneal needs to be controlled to avoid damaging the semiconductor. Namely, many chalcogenide elements are volatile, and thus if the anneal is performed at a high temperature in vacuum for a long period of time the chalcogenide elements can be evaporated away from the semiconductor. So it is desirable, as described above, to perform a RTA preferably in an atmosphere rich of the vapor form of the chalcogenide element or their compounds, like $H_2S$.

Given the above description of the overall process, an exemplary implementation of the present techniques to form source and drain region contacts to a LMDC-based transistor device are now described by way of reference to FIGS. 5-9. Specifically, FIGS. 5-9 illustrate an exemplary method for forming a LMDC-based transistor device.

Figure 5:
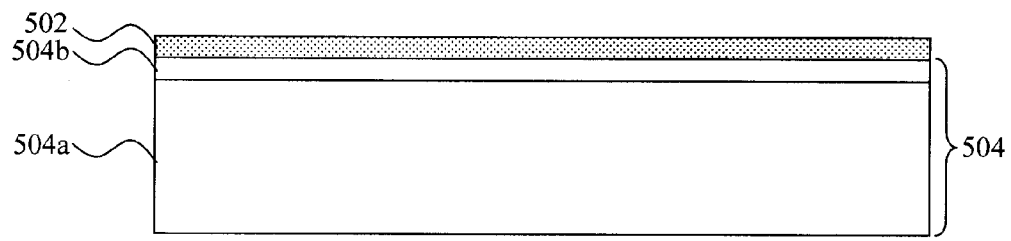
FIG. 5 is a cross-sectional diagram illustrating the starting structure for forming a LMDC-based transistor device including a substrate and LMDC material formed on the substrate according to an embodiment of the present invention.
Figure 6:
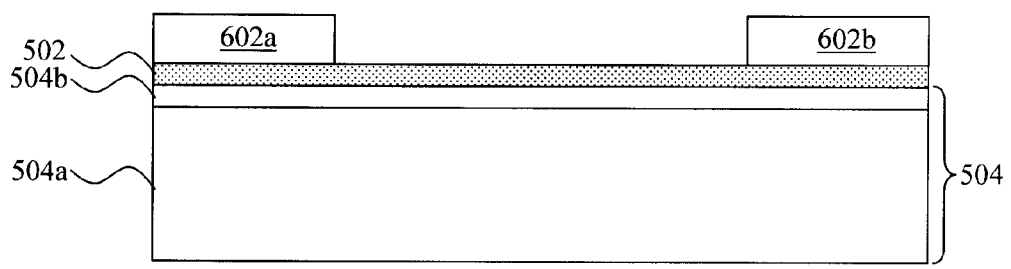
FIG. 6 is a cross-sectional diagram illustrating a contact metal having been deposited onto one or more portions of the LMDC material to form regions of contact metal over what will serve as source and drain regions of the device according to an embodiment of the present invention.
Figure 7:
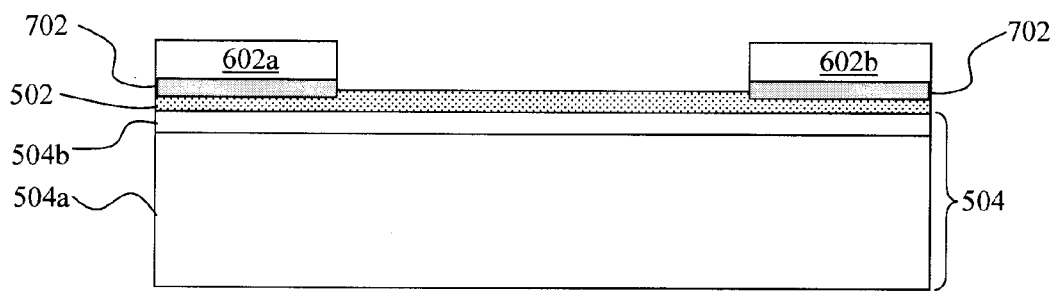
FIG. 7 is a cross-sectional diagram illustrating a thermal annealing having been used to form a buffer layer between the regions of contact metal the LMDC material that is compositionally a transition from the LMDC semiconductor material to the contact metal connected by covalent bonds according to an embodiment of the present invention.

As shown in FIG. 5, fabrication of the device begins with the formation of a LMDC semiconductor material 502 on a substrate 504. According to an exemplary embodiment, the substrate 504 is an insulating substrate. Namely, the substrate includes an (electrically) insulating material on which the LMDC semiconductor material 502 is formed.

One exemplary configuration of an insulating substrate is shown in FIG. 5, which includes a wafer 504a and a layer of an insulating material 504b on the wafer 504a (i.e., such that the LMDC semiconductor material 502 is formed on a side of the insulating material 504b opposite the wafer 504a). By way of example only, the insulating substrate can include a semiconductor wafer (e.g., a silicon (Si), germanium (Ge), or silicon germanium (SiGe)) wafer 504a having an oxide insulating layer 504b formed thereon. An oxide insulating layer can be formed on a semiconductor wafer, for example, by a process such as thermal oxidation (the oxide is referred to in that instance as a thermal oxide), by deposition, etc.

According to another, alternative, exemplary embodiment, the substrate 504 is configured to serve as a back gate of the device. To serve as a back gate of the device, the wafer 504a can be doped (e.g., with an n- or p-type dopant). In that instance, the insulating layer 504b may or may not be needed. Thus, substrate configurations are anticipated herein where the insulating material 504b is not present, and the LMDC semiconductor material 502 is formed directly on the (doped) wafer 504a (not shown).

As described in detail above, the LMDC material(s) may be deposited onto the substrate 504 (i.e., onto wafer 504a directly, or onto the insulating layer 504b, if present on the wafer—see above) using a top-down process such as exfoliation or a bottom-up process such as CVD (i.e., LPCVD, PECVD, etc.) or a solution-based deposition process (i.e., electroplating, casting, spin coating, etc.) to form from 1 layer (a single monolayer) to a stack of (multiple) layers, e.g., up to about 5 layers, of the LMDC material 502 on the wafer or insulating layer. As provided above, suitable LMDC materials include, but are not limited to materials having a formula $MX_2$, wherein M is a metal, and X is a chalcogen. LMDC materials exist in bulk form as stacks of strongly bonded layers with weak interlayer attraction, allowing exfoliation into individual, atomically thin layers. According to an exemplary embodiment, LMDC layer 502 includes one or more of $MoS/Se_2$, $WS/Se_2$, $SnS/Se_2$, and/or $InS/Se_2$.

The present process is then employed to form metal source and drain region contacts to the LMDC semiconductor material 502. Namely, a transistor generally includes a source region and a drain region interconnected by a channel. One or more gates regulate electron flow through the channel. In this example, the LMDC semiconductor material 502 will serve as an active layer of the device. Specifically, the source and drain regions, and the channel will be formed in the LMDC semiconductor material 502.

The process to form the metal source and drain region contacts (or simply "the metal contacts") begins with the deposition of a contact metal onto one or more portions of the LMDC semiconductor material 502. For instance, the present techniques may be employed to form any type of metal-LMDC ohmic junction. Thus, embodiments are generally considered herein where the contact metal is deposited as a blanket layer covering the entire LMDC semiconductor material 502.

However, in the instant example where it is desired to form distinct source and drain region contacts, it is preferable to selectively deposit the contact metal on (what will serve as the source and drain region) portions of the LMDC semiconductor material 502. This may be accomplished in a number of different ways. In one exemplary embodiment, the contact metal is blanket deposited onto the device structure, and then patterned (using standard lithography and etching techniques) into regions of contact metal 602a and 602b. See FIG. 6.

Alternatively, a lift-off process may be employed to selectively deposit the contact metal. For instance, a lift off mask may first be formed on the LMDC semiconductor material 502. The contact metal can then be deposited on the LMDC semiconductor material 502 through the lift off mask. After the contact metal is deposited, the lift off mask can be removed, and along with it, excess deposited metal. Here as well, the result will be the regions of contact metal 602a and 602b shown in FIG. 6.

As described above, by simply depositing a contact metal onto a LMDC semiconductor material, a non-ohmic metal-semiconductor junction, i.e., a Schottky barrier, is formed. While Schottky junctions are suitable for some applications, when forming source and drain region contacts for a transistor device an ohmic contact is needed. Accordingly, the present process is used to create a buffer layer between the contact metal and the underlying LMDC semiconductor, the result being an ohmic contact between the LMDC material and the contact metal. As highlighted above, formation of the LMDC buffer layer involves a thermal annealing process preferably after the contact metal has been deposited under conditions (e.g., temperature and duration—see below) sufficient to react the contact metal 602a and 602b with the underlying LMDC layer 502 to thereby form a buffer layer (see below) as an interface between the contact metal 602a and 602b and the LMDC semiconductor material 502 that compositionally is a transition from (LMDC) semiconductor to contact metal and which connects the LMDC semiconductor and the contact metal by covalent bonds. As provided above, many of the chalcogenide elements are volatile, and thus the atmosphere and the duration of anneal needs to be controlled to avoid damaging the semiconductor. For example, an RTA at the temperature and for the duration specified herein, preferably in the presence of a chalcogen-containing vapor—see above—can be employed to avoid damage to the LMDC.

Specifically, after the regions of contact metal 602a and 602b have been formed on the LMDC semiconductor material 502, e.g., by patterning, using a lift-off process, etc. as described above, the device structure is annealed (e.g., using an RTA process), for example, at a temperature of from about 300° C. to about 1000° C., for a duration of from about 10 seconds to about 1 hour, preferably in an atmosphere rich of the vapor form of the chalcogenide element or their compounds, like $H_2S$. This thermal annealing process results in the formation of a LMDC buffer layer 702 as an interface between the regions of contact metal 602a and 602b and the LMDC layer 502. See FIG. 7. The buffer layer 702 compositionally is a transition from stoichiometric (LMDC) semiconductor to (pure—i.e., no chalcogen) contact metal and connects the LMDC semiconductor and the contact metal by covalent bonds. Suitable annealing processes (e.g., RTA) were described above. An image of an exemplary LMDC buffer layer having been formed (via the present annealing process) between a layer of contact metal and an underlying LMDC semiconductor material is shown in FIG. 4 (described above).

Figure 8:
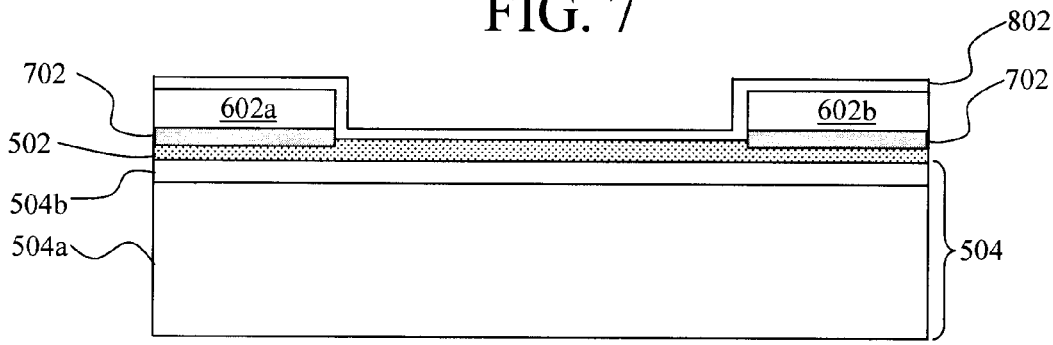
FIG. 8 is a cross-sectional diagram illustrating a gate dielectric having been deposited onto the device structure according to an embodiment of the present invention.

Next, a gate is formed over a portion of the LMDC semiconductor material 502 that will serve as a channel region of the transistor device. Oftentimes the gate in a transistor device is separated from the channel by a gate dielectric. Thus, as shown in FIG. 8, a gate dielectric 802 is deposited onto the device structure. As shown in FIG. 8, the gate dielectric 802 may be deposited as a blanket layer on the device structure, i.e., covering exposed surfaces of the contact metal 602a and 602b and the LMDC semiconductor material 502 therebetween (which serves as the channel region of the device).

Figure 8A:
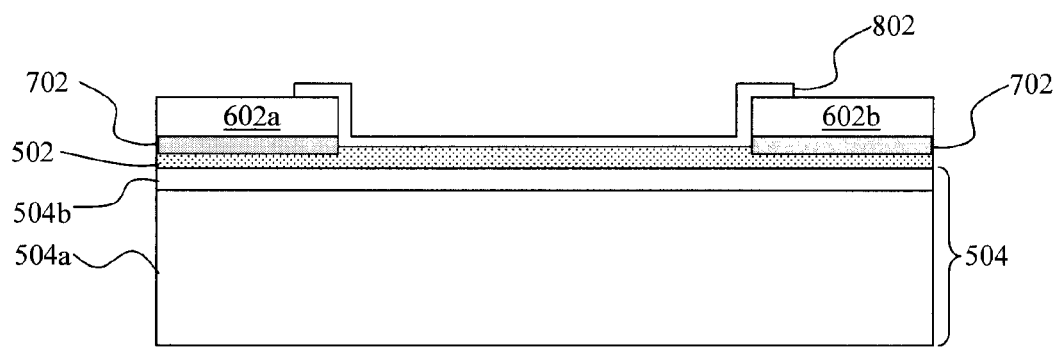
FIG. 8A is a cross-sectional diagram illustrating the gate dielectric having been optionally patterned to expose the regions of contact metal over the source and drain regions of the device according to an embodiment of the present invention.

In order to provide access to the source and drain contacts, it is also possible (following blanket deposition of the dielectric) to etch away at least a portion of the gate dielectric covering each of the regions of contact metal 602a and 602b (and thereby exposing at least a portion of each of the regions of contact metal 602a and 602b). This alternative embodiment is shown in FIG. 8A. Standard lithography and etching techniques may be employed to pattern the gate dielectric in this manner.

When the gate (to be formed over the gate dielectric as described below) is a metal gate, then it may be desirable to employ a high-k dielectric material as the gate dielectric 802. Suitable high-k dielectric materials include, but are not limited to, hafnium oxide and lanthanum oxide. When the gate is formed, for instance, from doped polysilicon, then silicon oxide might be used as the gate dielectric material.

Figure 9:
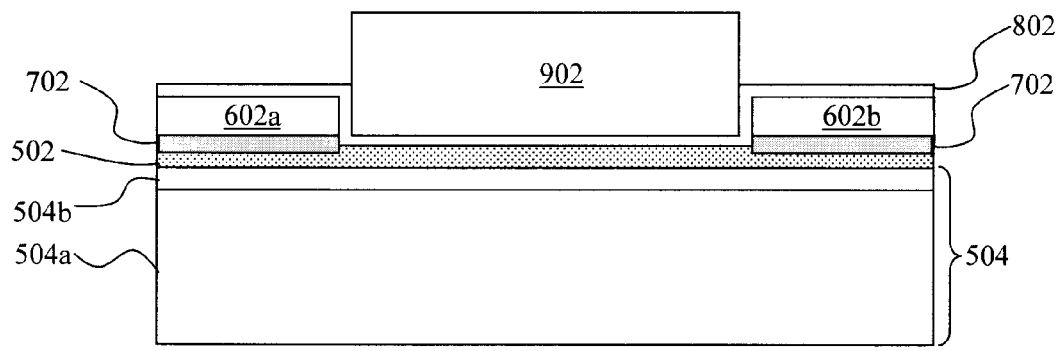
FIG. 9 is a cross-sectional diagram illustrating a gate having been formed on the gate dielectric over a portion of the LMDC semiconductor material that serves as a channel of the device according to an embodiment of the present invention.

Next, as shown in FIG. 9, a gate (electrode) 902 is formed over portion of the LMDC semiconductor material 502 between the regions of contact metal 602a and 602b which serves as the channel of the device. The gate electrode 902 is separated from the LMDC semiconductor material 502 channel by the gate dielectric 802. While the blanket layer of gate dielectric example from FIG. 8 is being shown in FIG. 9, the patterned gate dielectric configuration of FIG. 8A could be implemented in the same manner (with the above-described intervening dielectric patterning step).

The gate 902 may be formed by first depositing a layer of a gate material(s) onto the device structure, and then patterning the layer to form a distinct gate(s) 902. Suitable gate materials include a metal(s) and/or doped polysilicon.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a metal contact to a two-dimensional layered metal dichalcogenides (LMDC) semiconductor material, the method comprising the steps of:
    depositing a contact metal onto the LMDC semiconductor material; and
    annealing the LMDC semiconductor material and the contact metal under conditions sufficient to react the contact metal with the LMDC semiconductor material and thereby form a buffer layer as an interface between the contact metal and the LMDC semiconductor material that compositionally is a transition from the LMDC semiconductor material to the contact metal and connects the LMDC semiconductor material and the contact metal by covalent bonds.

2. The method of claim 1, wherein the LMDC semiconductor material comprises a material having a formula $MX_2$, wherein M is a metal, and X is a chalcogen.

3. The method of claim 1, wherein the LMDC semiconductor material comprises a single monolayer of LMDC material.

4. The method of claim 1, wherein the LMDC semiconductor material is in a bulk form comprising a stack of up to about 5 layers of LMDC material.

5. The method of claim 1, wherein the LMDC semiconductor material comprises $MoS/Se_2$, $WS/Se_2$, $SnS/Se_2$, or $InS/Se_2$.

6. The method of claim 1, wherein the contact metal is copper, molybdenum, tungsten, indium, tin, or an alloy including at least one of the foregoing metals.

7. The method of claim 1, wherein the conditions comprise a temperature of from about 300° C. to about 1000° C.

8. The method of claim 1, wherein the conditions comprise a duration of from about 10 seconds to about 1 hour.

9. A method for forming a LMDC-based transistor device, the method comprising the steps of:
    forming a LMDC semiconductor material on a substrate;
    selectively depositing a contact metal onto portions of the LMDC semiconductor material that serve as source and drain regions of the transistor device;
    annealing the LMDC semiconductor material and the contact metal under conditions sufficient to react the contact metal with the LMDC semiconductor material and thereby form a buffer layer as an interface between the contact metal and the LMDC semiconductor material that compositionally is a transition from the LMDC semiconductor material to the contact metal and connects the LMDC semiconductor material and the contact metal by covalent bonds;
    depositing a gate dielectric onto exposed surfaces of the contact metal and the LMDC semiconductor material; and
    forming a gate on the gate dielectric over a portion of the LMDC semiconductor material that serves as a channel of the transistor device.

10. The method of claim 9, wherein the substrate comprises an insulating material on which the LMDC semiconductor material is formed.

11. The method of claim 9, wherein the substrate comprises a doped semiconductor wafer on which the LMDC semiconductor material is formed.

12. The method of claim 9, wherein the LMDC semiconductor material is formed as a single monolayer of LMDC material on the substrate.

13. The method of claim 9, wherein the LMDC semiconductor material is formed in a bulk form on the substrate comprising a stack of up to about 5 layers of LMDC material.

14. The method of claim 9, wherein the LMDC semiconductor material comprises a material having a formula $MX_2$, wherein M is a metal, and X is a chalcogen.

15. The method of claim 9, wherein the LMDC semiconductor material comprises $MoS/Se_2$, $WS/Se_2$, $SnS/Se_2$, or $InS/Se_2$.

16. The method of claim 9, wherein the contact metal is copper, molybdenum, tungsten, indium, tin, or an alloy including at least one of the foregoing metals.

17. The method of claim 9, wherein the conditions comprise a temperature of from about 300° C. to about 1000° C.

18. The method of claim 9, wherein the conditions comprise a duration of from about 10 seconds to about 1 hour.

19. A LMDC-based transistor device, comprising:
    a LMDC semiconductor material on a substrate;
    a contact metal present on portions the LMDC semiconductor material that serve as source and drain regions of the transistor device;
    a buffer layer as an interface between the contact metal and the LMDC semiconductor material that compositionally is a transition from the LMDC semiconductor material to the contact metal and which connects the LMDC semiconductor material and the contact metal by covalent bonds;
    a gate dielectric on the contact metal and the LMDC semiconductor material; and
    a gate on the gate dielectric over a portion of the LMDC semiconductor material that serves as a channel of the transistor device.

20. The transistor device of claim 19, wherein the layer of the LMDC semiconductor material comprises a material having a formula $MX_2$, wherein M is a metal, and X is a chalcogen.

21. The transistor device of claim 19, wherein the LMDC semiconductor material comprises $MoS/Se_2$, $WS/Se_2$, $SnS/Se_2$, or $InS/Se_2$.

* * * * *